(12) United States Patent
Schatzberger et al.

(10) Patent No.: US 8,537,586 B2
(45) Date of Patent: Sep. 17, 2013

(54) MEMORY ARRAY AND STORAGE METHOD

(75) Inventors: Gregor Schatzberger, Graz (AT);
Andreas Wiesner, Edelschrott (AT)

(73) Assignee: AMS AG, Unterpremstaetten (AT)

( * ) Notice: Subject to any disclaimer, the term of this patent is extended or adjusted under 35 U.S.C. 154(b) by 519 days.

(21) Appl. No.: 12/667,666

(22) PCT Filed: Jul. 2, 2008

(86) PCT No.: PCT/EP2008/058532
§ 371 (c)(1),
(2), (4) Date: Jun. 14, 2010

(87) PCT Pub. No.: WO2009/004040
PCT Pub. Date: Jan. 8, 2009

(65) Prior Publication Data
US 2010/0277966 A1    Nov. 4, 2010

(30) Foreign Application Priority Data
Jul. 3, 2007    (DE) .......................... 10 2007 030 842

(51) Int. Cl.
*G11C 5/06* (2006.01)
(52) U.S. Cl.
USPC ........................................................ 365/63
(58) Field of Classification Search
USPC ........................................................ 365/63
See application file for complete search history.

(56) References Cited

U.S. PATENT DOCUMENTS

| | | | |
|---|---|---|---|
| 4,758,988 A | 7/1988 | Kuo | |
| 4,855,955 A | 8/1989 | Cioaca | |
| 4,970,691 A | 11/1990 | Atsumi et al. | |
| 5,796,670 A | 8/1998 | Liu | |
| 5,822,248 A * | 10/1998 | Satori et al. | 365/185.21 |
| 6,754,123 B2 * | 6/2004 | Perner et al. | 365/209 |
| 6,765,825 B1 | 7/2004 | Scott | |
| 7,161,832 B2 | 1/2007 | Kato et al. | |
| 2006/0092683 A1 | 5/2006 | Li et al. | |

FOREIGN PATENT DOCUMENTS

| | | |
|---|---|---|
| DE | 10 2004 046 793 | 5/2006 |
| WO | WO 2006/034782 | 4/2006 |

* cited by examiner

*Primary Examiner* — Anthan Tran
(74) *Attorney, Agent, or Firm* — McDermott Will & Emery LLP

(57) ABSTRACT

A memory arrangement comprises a first memory transistor (11) for non-volatile storage of a first bit, a second memory transistor (17) for non-volatile storage of the first bit in inverted form, and a word line (29) that is connected to a control terminal (12) of the first memory transistor (11) and a control terminal (18) of the second memory transistor (17). The memory arrangement further comprises a read amplifier (23) with a first input (24) that is coupled to the first memory transistor (11) for supplying a first bit line signal (BL1), a second input (25) that is coupled to the second memory transistor (17) for supplying a second bit line signal (BL2), and an output (26) for provision of an output signal (SOUT) as a function of the first bit line signal (BL1) and the second bit line signal (BL2).

13 Claims, 8 Drawing Sheets

FIG 1B

| EEPROM Function | Programming | Erasing | Reading |
|---|---|---|---|
| selected word line signal WL1 | VPP | 0V | 0V |
| non-selected word line signals WL2, WL3 | 0V | VPP | VDD |
| selected bit line signals BL1, BL2 | 0V | VBIAS/VPP | data |
| non-selected bit line signals BL3, BL4, BL5, BL6 | VBIAS | VBIAS | floatend |
| selected well voltage WE1 | 0V | VPP | VDD |
| non-selected well voltages WE2, WE3 | VPP | VPP | VDD |
| selection signal SL | VPP | VPP | 0V |
| terminal voltages SL1, SL2, SL3 | off | off | on |

FIG 2B

| EEPROM Function | Programming | Erasing | Reading |
|---|---|---|---|
| selected word line signal WL1 | VPP | 0V | 0V |
| non-selected word line signals WL2, WL3 | 0V | VPP | VDD |
| selected bit line signal BL1 | 0V/VBIAS | VBIAS/VPP | data |
| selected bit line signal BL2 | VBIAS/0V | VBIAS/VPP | data |
| non-selected bit line signals BL3, BL4, BL5, BL6 | VBIAS | VBIAS | floatend |
| selected well voltage WE1 | 0V/VPP | VPP | VDD |
| selected well voltage WEA1 | VPP/0V | VPP | VDD |
| non-selected well voltages WE2, WEA2, WE3, WEA3 | VPP | VPP | VDD |
| selection signal SL | VPP | VPP | 0V |
| terminal voltages SL1, SL2, SL3 | off | off | on |

MEMORY ARRAY AND STORAGE METHOD

RELATED APPLICATIONS

This is a U.S. national stage of application No. PCT/EP2008/058532, filed on Jul. 2, 2008.

This application claims the priority of German application no. 10 2007 030 842.8 filed Jul. 3, 2007, the entire content of which is hereby incorporated by reference.

FIELD OF THE INVENTION

The present invention relates to a memory arrangement and a method for storing at least one bit.

BACKGROUND OF THE INVENTION

A memory arrangement can comprise a memory transistor for non-volatile storage of one bit.

Document DE 102004046793 B3 describes a non-volatile memory element that comprises two cross-coupled metal oxide semiconductor field-effect transistors, MOSFETs for short, each with a floating control electrode, "floating gate" in English.

Document U.S. Pat. No. 4,855,955 specifies a memory cell with two series-connected transistors that comprise two floating gate MOSFETs and a selection transistor.

A memory arrangement in which data are supplied simultaneously from two arrays to a read amplifier is shown in document U.S. Pat. No. 4,758,988.

Document US 2006/0092683 A1 describes a non-volatile memory with a block that comprises a first and a second sub-block, which are arranged in separate wells.

Documents U.S. Pat. No. 4,970,691, U.S. Pat. No. 6,765,825 B1 and U.S. Pat. No. 7,161,832 B2 show additional memory arrangements for non-volatile storage of a bit.

SUMMARY OF THE INVENTION

One object of the present invention is to provide a memory arrangement and a method for storing at least one bit that result in a long service life of the memory arrangement.

In one embodiment, a memory arrangement comprises a first and a second memory transistor for non-volatile storage of a first bit of information to be stored. The memory arrangement further comprises a word line that is connected to a control terminal of the first memory transistor and a control terminal of the second memory transistor. In addition, the memory arrangement comprises a read amplifier with a first and a second input as well as an output. For reading out respective information to be stored, the first input of the read amplifier is coupled to the first memory transistor, and the second input to the second memory transistor.

The first memory transistor is provided for storing a first bit, and the second memory transistor for storing the first bit in inverted form. A first bit line signal, which is routed to the first input of the read amplifier, can be sensed at the first memory transistor. Correspondingly a second bit line signal, which is routed to the second input of the read amplifier, can be sensed at the second memory transistor. An output signal that is generated as a function of the first and the second bit line signal is provided at the output of the read amplifier.

The memory arrangement advantageously comprises two memory transistors for storing one bit. Thus the reliability is enhanced in comparison to a memory arrangement in which only one memory transistor is provided for storing one bit. The first and the second memory transistor advantageously store the first bit in both inverted and non-inverted form. It is also assured in this way that, in case of any drift of the first or the second memory transistor, the first bit line signal is provided at a value that clearly differs from a value of the second memory transistor, so that the output signal of the read amplifier represents the first bit with high reliability, and a long service life of the memory arrangement is achieved.

In a preferred embodiment, the first and the second memory transistor are in different operating states after a write process. If the first bit has the logic value 1, then the first memory transistor stores the logic value 1 and the second memory transistor stores the logic value 0. If the first bit has the logic value 0, then the first memory transistor stores the logic value 0 and the second memory transistor stores the logic value 1. Therefore, the two memory transistors are in complementary operating states or charge states after the write process.

The memory arrangement can comprise a semiconductor body.

In one embodiment, the semiconductor body comprises a first well. The first and the second memory transistor are arranged in the first well. A well voltage can be supplied by means of a first well terminal to the first well.

Alternatively or additionally, the first well can comprise the first and the second memory transistor.

In an alternative embodiment, the semiconductor body comprises the first well and a second well. The first memory transistor is arranged in the first well. The well voltage can be supplied by means of the first well terminal to the first well. The second memory transistor is arranged in the second well. A second well voltage can be supplied by means of a second well terminal to the second well.

Alternatively or additionally, the first well can comprise the first memory transistor and the second well can comprise the second memory transistor.

In one embodiment, both the first and the second memory transistor are programmed in a first step. Only in a second step is either the first memory transistor or the second memory transistor erased, depending on the value of the first bit. Therefore, the first and the second memory transistor store the first bit only after the second step.

In an alternative embodiment, only one of the two memory transistors is programmed during the storage of the first bit, and only the other of the two memory transistors is erased. In an arrangement of the two memory transistors in two separate wells, the first memory transistor can advantageously be programmed or erased independently of the second memory transistor. Thereby the number of programming and erasing processes of the memory transistors is reduced, so that the service life of the memory arrangement is increased.

In one embodiment, the memory arrangement comprises at least one third and one fourth memory transistor for non-volatile storage of at least one additional bit, as well as at least one additional word line, which is connected to a control terminal of the at least one third memory transistor and a control terminal of the at least one fourth memory transistor. The read amplifier is coupled at the first input to the at least one third memory transistor, and at the second input, to the at least one fourth memory transistor. The at least one third memory transistor and the at least one fourth memory transistor store mutually pairwise different information bits.

In one embodiment, the first memory transistor and the at least one third memory transistor are coupled via a first bit line to the first input of the read amplifier.

Correspondingly, the second memory transistor and the at least one fourth memory transistor are coupled via a second bit line to the second input of the read amplifier. By means of the word lines, whether the first and the second memory transistor, or the at least one third and the at least one fourth memory transistor, outputs a signal to the first and the second bit line is selected. If the first and the second memory transistors are activated by means of a word line signal on the word line, then the first and the second memory transistors output the first and the second bit line signal to the first and the second bit line. On the other hand, if the at least one third and the at least one fourth memory transistors are activated by means of at least one additional word line signal on the at least one additional word line, then the at least one third and the at least one fourth memory transistors output the first and the second bit line signal to the first and the second bit lines.

In one embodiment, the first well comprises the first, the second, the at least one third and the at least one fourth memory transistor. In an alternative embodiment, the first well comprises the first and the at least one third memory transistor. In this case, the second well comprises the second and the at least one fourth memory transistor.

Electrons can be brought to a floating gate of the memory transistors by means of a hot carrier mechanism. Electrons can preferably be brought to the floating gate of the memory transistors by means of a Nordheim-Fouler tunnel mechanism. The Nordheim-Fouler tunnel mechanism advantageously allows a larger number of write processes compared to the hot carrier mechanism.

The memory arrangement can be used in systems for measurement and control technology. In particular, it can be used for power and water meters. The memory arrangement can advantageously retain the data even if a supply voltage of the memory arrangement is disconnected.

In one embodiment, a method for storing at least one bit comprises a non-volatile storage of a first bit in a first memory transistor of a memory arrangement, and a non-volatile storage of the first bit in inverted form in a second memory transistor of a memory arrangement. A word line signal is applied simultaneously to a control terminal of the first memory transistor and a control terminal of the second memory transistor. The method further comprises the outputting of an output signal as a function of a first bit line signal that is provided by the first memory transistor, and as a function of a second bit line signal that is provided by the second memory transistor, as a function of the respective stored information.

The first bit is advantageously stored by means of two memory transistors, so that the reliability in the storage of the first bit is increased. A high reliability and thus a long service life of the memory arrangement are achieved by the generation of the output signal as a function of the signals of two memory transistors. The first and the second memory transistor are read out in parallel to generate the output signal. Storage can be referred to as a write process. A write process can comprise a programming and/or erasing.

In one embodiment, the memory arrangement comprises a semiconductor body. The semiconductor body comprises a first well. The first memory transistor is arranged in the first well. A well voltage is supplied by means of a first well terminal to the first well.

In one embodiment, the second memory transistor is arranged in the first well.

In an alternative embodiment, the semiconductor body comprises a second well. The second memory transistor is arranged in the second well. A second well voltage is supplied by means of a second well terminal to the second well.

BRIEF DESCRIPTION OF THE DRAWINGS

The invention will be explained in detail below for several embodiments with reference to the figures. Components and circuit elements with identical function or effect bear identical reference characters. Insofar as circuit parts or components correspond to one another in function, the description thereof will not be repeated for each of the figures below.

The figures show the following:

FIGS. 1A-1C, an exemplary embodiment of the memory arrangement according to the invention, FIGS. 2A-2C, an additional exemplary embodiment of the memory arrangement according to the invention, FIG. 3, a read amplifier, and FIGS. 4A and 4B, representations of the dependence of a current through a memory transistor on a number of write processes.

DETAILED DESCRIPTION OF THE DRAWINGS

Figure 1A:
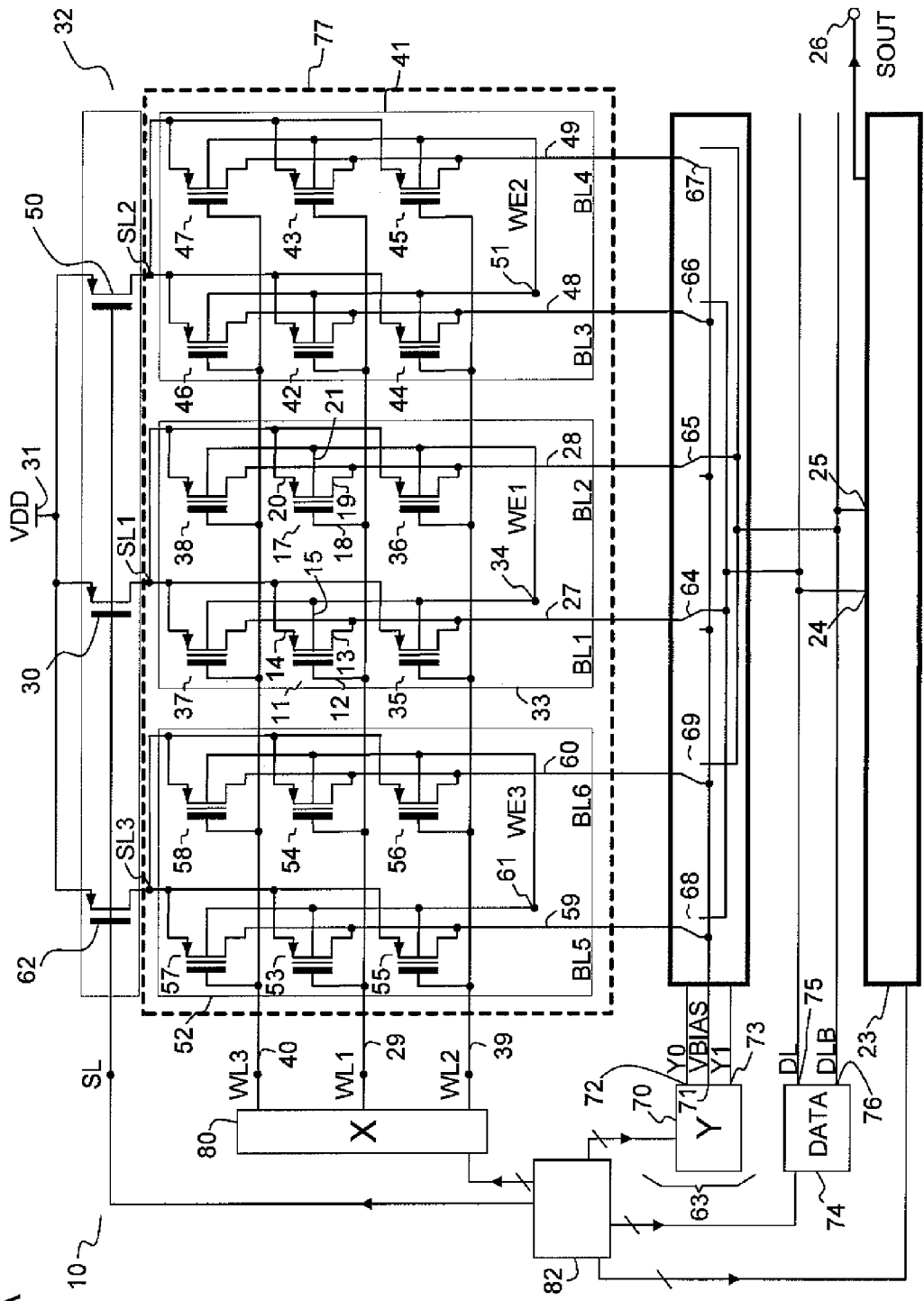

FIG. 1A shows an exemplary embodiment of a memory arrangement according to the invention. The memory arrangement 10 comprises a first and a second memory transistor 11, 17. The first memory transistor 11 has a control terminal 12, a first and a second terminal 13, 14 and a substrate terminal 15. The second memory transistor 17 correspondingly has a control terminal 18, a first and a second terminal 19, 20 and a substrate terminal 21. The memory arrangement 10 comprises a read amplifier 23 that comprises a first and a second input 24, 25 and an output 26. The first input 24 is coupled to the first memory transistor 11, and the second input 25 of the read amplifier 23 is coupled to the second memory transistor 17. The First terminal 13 of the first memory transistor 11 is connected here to a first bit line 27, which is connected to the first input 24 of the read amplifier 23. Correspondingly the first terminal 19 of the second memory transistor 17 is connected to a second bit line 28, which is connected to the second input 25 of the read amplifier 23.

The memory arrangement 10 comprises a word line 29, to which the control terminal 12 of the first memory transistor 11 and the control terminal 18 of the second memory transistor 17 are connected. The connections of the control terminals 12, 18 of the first and the second memory transistor 11, 17 to one another and to the word line 29 are permanent. The second terminal 14 of the first memory transistor 11 and the second terminal 20 of the second memory transistor 17 are coupled via a first selection transistor 30 to a first supply voltage terminal 31. The memory arrangement 10 is integrated on a semiconductor body 32. The semiconductor body 32 has a first well 33 that comprises the first and the second memory transistor 11, 17. The substrate terminal 15 of the first memory transistor 11 and the substrate terminal 21 of the second memory transistor 17 are connected to a first well terminal 34. The first well 33 is n-doped.

The memory arrangement 10 further comprises a third, a fourth, a fifth and a sixth memory transistor 35-38. The third, fourth, fifth and sixth memory transistor 35-38 are arranged in the first well 33. A control terminal of the third memory transistor 35 and a control terminal of the fourth memory transistor 36 are connected to an additional word line 39. Correspondingly a control terminal of the fifth memory transistor 37 and a control terminal of the sixth memory transistor 38 are connected to an additional word line 40. A first terminal of the third memory transistor 35 and a first terminal of the fifth memory transistor 37 are connected to the first bit line 27. Correspondingly, a first terminal of the fourth memory transistor 36 and a first terminal of the sixth memory transistor 38 are connected to the second bit line 28. The second terminals of the third, fourth, fifth and sixth memory transistor 35-38 are likewise coupled to the first supply voltage terminal 31 via the selection transistor 30. The substrate terminals of the third, fourth, fifth and sixth memory transistor 35-38 are connected to the first well terminal 34.

In addition, the semiconductor body 32 comprises a second well 41. The memory arrangement 10 comprises a seventh, an eighth, a ninth, a tenth, an eleventh and a twelfth memory transistor 42-47, which are arranged in the second well 41. A control terminal of the seventh memory transistor 42 and a control terminal of the eighth memory transistor 43 are likewise connected to the word line 29. Correspondingly, a control terminal of the ninth memory transistor 44 and a control terminal of the tenth memory transistor 45 are connected to the additional word line 39. In addition, a control terminal of the eleventh memory transistor 46 and a control terminal of the twelfth memory transistor 47 are connected to the additional word line 40. A first terminal of the seventh, ninth and eleventh memory transistor 42, 44, 46 is connected to a third bit line 48, which is coupled to the first input 24 of read amplifier 23. Correspondingly, a first terminal of the eighth, tenth and twelfth memory transistor 43, 45, 47 is connected to a fourth bit line 49, which is coupled to the second input 25 of the read amplifier 23. The second terminals of the six memory transistors 42-47 are likewise coupled to the first supply voltage terminal 31 via an additional selection transistor 50. The substrate terminals of the six memory transistors 42-47 are connected to an additional well terminal 51.

In a corresponding manner, the semiconductor body 32 comprises a third well 52. The second and the third well 41, 52 are n-doped. The memory arrangement 10 comprises a thirteenth through eighteenth memory transistor 53-58, which are arranged in the third well 52. The substrate terminals of the six memory transistors 53-58 are connected to the word line 29, the further word line 39 and the additional word line 40. The first terminals of the thirteenth, fifteenth and seventeenth memory transistor 53, 55, 57 are connected to a fifth bit line 59 and the first terminals of the fourteenth, sixteenth and eighteenth memory transistor 54, 56, 58 are connected to a sixth bit line 60. The fifth bit line 59 is coupled to the first input 24 and the sixth bit line 60 is coupled to the second input 25 of the read amplifier 23. The substrate terminals of the six memory transistors 53-58 are connected to an additional well terminal 61. The second terminals of the six memory transistors 53-58 are coupled to the first supply voltage terminal 31 via an additional selection transistor 62. The control terminals of the three selection transistors 30, 50, 62 are connected to one another. The selection transistors 30, 50, 62 are implemented as p-channel MOSFETs.

The memory arrangement 10 further comprises a Y-decoder 63 that comprises a first, a second, a third, a fourth, a fifth and a sixth changeover switch 64-69 and a Y-decoder controller 70. The changeover switches 64-69 are implemented as transmission gates. The six changeover switches 64-69 are connected on the input side to the six bit lines 27, 28, 48, 49, 59, 60. A first terminal of the first, third and fifth changeover switch 64, 66, 68 is connected to the first input 24 of the read amplifier 23. Correspondingly, a first terminal of the second, fourth and sixth changeover switch 65, 67, 69 is connected to the second input 25 of the read amplifier 23.

A second terminal of each of the six changeover switches 64-69 is connected to a supply voltage output 71 of the Y-decoder controller 70. Thus, the first bit line 27 is connected by means of the first changeover switch 64 either to the supply output 71 or to the first terminal 24 of the read amplifier 23. Correspondingly, the second bit line 28 is connected by means of the second changeover switch 65 either to the supply output 71 or to the second input 25 of the read amplifier 23. Correspondingly, the third and the fifth bit lines 48, 59 are respectively connected via the third and the fifth changeover switch 66, 68 either to the first input 24 of the read amplifier 23 or to the supply terminal 71. By contrast, the fourth and the sixth bit lines 49, 60 are respectively connected via the fourth and the sixth changeover switches 67, 69 to the second input 25 of the read amplifier 23 or to the supply output 71. The Y-decoder controller 70 additionally has a first and a second control output 72, 73, which are connected to the control inputs of the six changeover switches 64-69.

In addition, the memory arrangement 10 has a data driver 74 that is connected at a first driver output 75 to the first terminals of the first, the third and the fifth changeover switch 64, 66, 68, as well as to the first input 24 of the read amplifier 23. The data driver 74 is additionally connected at a second driver output 76 to the first terminals of the second, fourth and sixth changeover switch 65, 67, 69, as well as to the second input 25 of the read amplifier 23 The memory arrangement 10 further comprises an X-decoder 80 and a control logic unit 82. The word lines 29, 39, 40 are connected to three outputs of the X-decoder 80. The control logic unit 82 is connected on the output side to the control terminals of the selection transistors 30, 50, 62, the X-decoder 80, the Y-decoder controller 70, the data driver 74 and the read amplifier 23, as well as via not-indicated connections to the well terminals 34, 51, 61. The memory arrangement 10 thus comprises an array 77 that comprises the first, second and third well 33, 41, 52. The array 77 has 18 memory transistors 11, 17, 35-38, 42-47 and 53-58.

The memory arrangement 10 is implemented in a complementary metal oxide semiconductor technology, abbreviated CMOS-technology. The selection transistors 30, 50, 62, the 18 memory transistors, an output stage of the Y-decoder controller 70, the changeover switches 64-69, an output stage of the X-decoder 80 and an output stage of the data driver 74 are implemented in a high-voltage CMOS technology. In high-voltage CMOS technology, a voltage between the first terminal and the second terminal of the respective transistor, between the control terminal and the first terminal, as well as between the control terminal and the second terminal of the respective transistor can have a value from an interval of 5 to 15 V.

The memory transistors 11, 17, 35-38, 42-47 and 53-58 are constructed as EEPROM memory transistors. The memory transistors are implemented as p-channel MOSFETs. The memory transistors each have a floating gate electrode that is arranged between the respective control terminal and the respective well. The respective well is n-doped. An oxide, referred to as a tunnel oxide, is formed between the floating gate and the well. In a programming process, electrons are drawn through the tunnel oxide because of the difference in potential between the floating gate and the well, or between the control terminal and the well, and accumulate at the floating gate. In an erasing process, a potential difference between the floating gate and the well is generated in such a manner that electrons diffuse from the floating gate to the well. A threshold voltage of a memory transistor depends on the charge level on the floating gate. In a reading process, a value of the threshold voltage or, related thereto, a value of the current flowing through the first and second terminal of a memory transistor is therefore determined. If numerous electrons are present at the floating gate, the memory transistor is conductive. On the other hand, if no electrons are present at the floating gate, the memory transistor is in a blocking state.

A first supply voltage VDD is present at the first supply voltage terminal 31. A bias voltage VBIAS is provided at the supply output 71 of the decoder controller 70. The X-decoder 80 outputs a word line signal WL1 to the word line 29, a further word line signal WL2 to the further word line 39 and an additional word line signal WL3 to the additional word line 40. The first bit line 27 has a first bit line signal BL1. Correspondingly, the second, third, fourth, fifth and sixth bit line 28, 48, 49, 59, 60 have a second, third, fourth, fifth and sixth bit line signal BL2, BL3, BL4, BL5, BL6. A first well voltage WE1 is supplied by the control logic unit 82 to the first well terminal 34, a further well voltage WE2 to the further well terminal 51, and an additional well voltage WE3 to the additional well terminal 61.

A selection signal SL is routed by the control logic unit 82 to the selection transistors 30, 50, 62. A terminal voltage SL1 is applied at a node between the first selection transistor 30 and the memory transistor of first well 33. Correspondingly, a further terminal voltage SL2 is present at a node between the further selection transistor 50 and the memory transistors of the second well 41, and an additional terminal voltage SL3 is present at a node between the additional selection transistor 62 and the memory transistors of the third well 52. The function of the memory arrangement shown in FIG. 1A will be explained further by means of FIGS. 1B and 1C.

If one switches off the first supply voltage VDD of the memory arrangement 10, then the electrons are advantageously maintained on the floating gates of the memory transistors.

In an alternative embodiment, the memory transistors can also be implemented as n-channel MOSFETs. The wells 33, 41, 52 are then p-doped. The potentials for the programming, deleting and reading process are also appropriately adapted.

In one embodiment, the semiconductor body 32 can comprise the selection transistor 30, the further selection transistor 50, the additional selection transistor 62, the word line 29, the further word line 39, the additional word line 40, the first, second, third, fourth, fifth and sixth bit line 27, 28, 48, 49, 59, 60, the control logic unit 82, the Y-decoder 63, the data driver 74, the X-decoder 80 and/or the read amplifier 23.

In an alternative embodiment not shown, the memory arrangement 10 comprises a page register. In a write process using a page register, one or more bits can selectively be written simultaneously into the memory arrangement. The maximum number of bits that can be simultaneously written depends on the size of the page register. The write speed is advantageously increased with the aid of the page register.

In one embodiment, the memory arrangement operates with an error checking and correcting method, abbreviated as ECC method. For this purpose, the memory arrangement comprises reserve memory transistors. The ECC method can be implemented in accordance with the Hamilton code, the binary coded decimal code, abbreviated as BCD code, or the Goley code. In the ECC method, the reserve memory transistors replace the defective memory transistors. Thereby, premature memory failures can advantageously be trapped, and the yield of the memory arrangement can be increased. The failure of more than one memory transistor can advantageously be trapped with the ECC method.

Figure 1C:
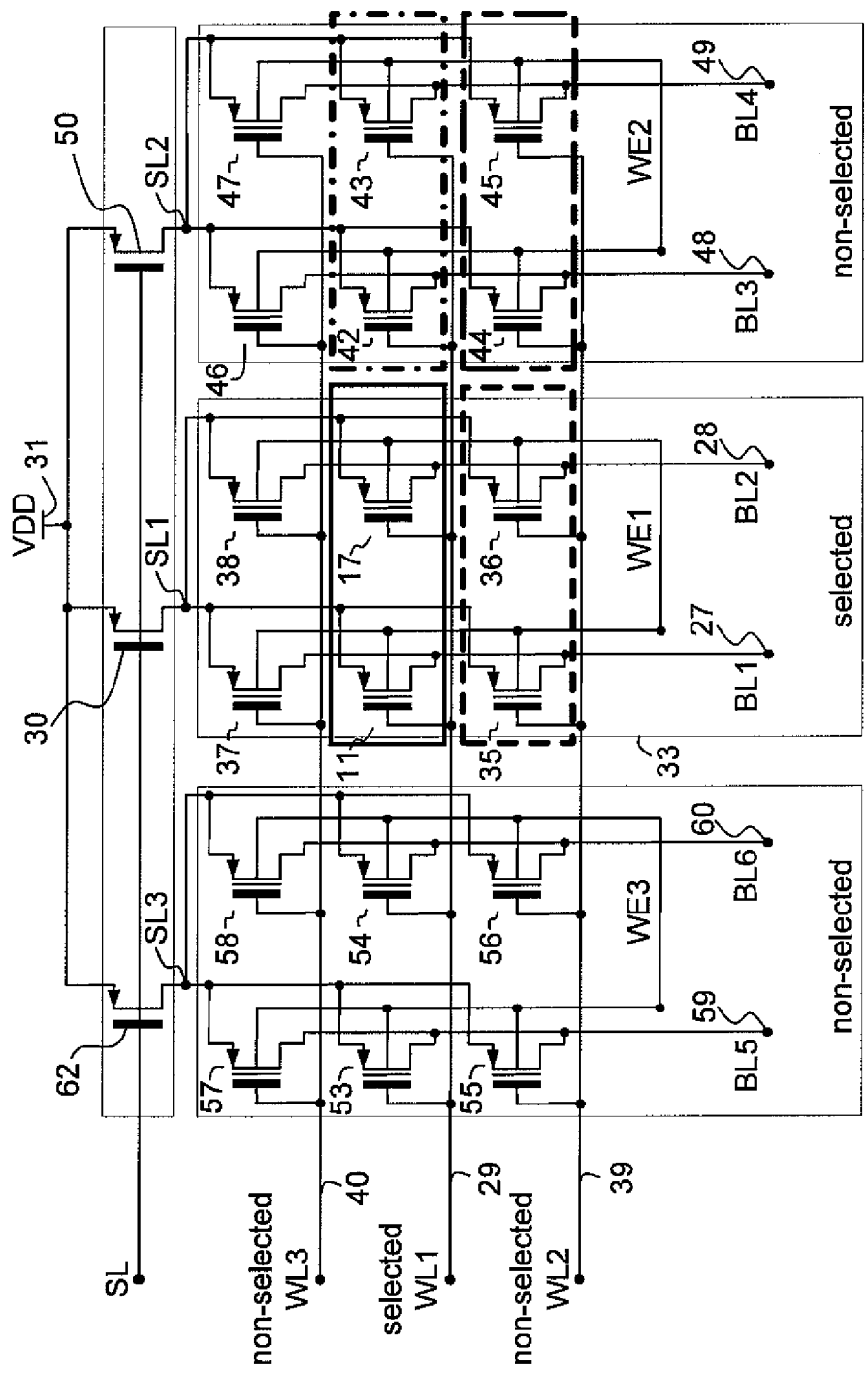

FIG. 1B shows an exemplary embodiment of the signals that are applied to the terminals of the memory arrangement 10 in accordance with FIG. 1A during a programming, an erasing and a reading process. FIG. 1C shows a section of the memory arrangement in accordance with FIG. 1A in which the selected lines and wells are drawn in. For the sake of example, FIGS. 1B and 1C show the programming, erasing and reading of the first and the second memory transistor 11, 17 to store and read a first bit.

In a programming process of the first and the second memory transistor 11, 17, the word line signal WL1 has a value of a second supply voltage VPP. The second supply voltage VPP can have a value from an interval between 10 V and 15 V, for example. The second supply voltage VPP is a high voltage. The further word line signal WL2 and the additional word line signal WL3 have the value 0. The first and the second bit line signals BL1, BL2 are provided with the value 0 V. The third, fourth, fifth and sixth bit line signal BL3, BL4, BL5, BL6 have the value of the bias voltage VBIAS. The well voltage WE1 with a value of 0 V is supplied to the first well 34. The further well voltage WE2 and the additional well voltage WE3 have the value of the second supply voltage VPP. The selection signal SL has the value of the second supply voltage VPP. The three terminal voltages SL1, SL2, SL3 are cut off. The first and the second memory transistors 11, 17 are programmed by a voltage difference between the word line 29 and the well 33. The difference between the word line signal WL1 and the well voltage WE1, which is the value of the second supply voltage VPP, is present between the control terminals 12, 18 of the first and the second memory transistors 11, 17 and the well 33, so that the first and the second memory transistors 11, 17 are programmed.

Since the further and the additional word line signals WL2, WL3 have the value 0, third through sixth memory transistors 35-38 are not programmed during the programming of the first and the second memory transistor 11, 17. Since the further word line signal WL2 has the value 0 V, the further well voltage WE2 has the value of second supply voltage VPP and the third bit line signal BL3 has the value of bias voltage VBIAS, both a programming and an erasing of the seventh and the eighth memory transistor 44, 45 is avoided. The state of one of the memory transistors remains unchanged so long as a voltage between the floating gate and the well is less than the bias voltage VBIAS. The bias voltage VBIAS has the value of the first supply voltage VDD minus the value of the threshold voltage of a memory transistor. In an alternative embodiment, the bit line signals BL3, BL4, BL5, BL6 of the non-selected bit lines 48, 49, 59, 60 can have the value 0 V in a programming process.

In order to prevent the seventh, and/or the eighth memory transistor 42, 43 from being programmed or erased during the programming of the first and the second memory transistor 11, 17, the word line signal WL1 and the further well voltage WE2 have the value of the second supply voltage VPP, and the third and the fourth bit line signal BL3, BL4 have the value of bias voltage VBIAS. On the contrary, in order to prevent the seventh, and/or the eighth memory transistor 42, 43 from being programmed or erased during the erasure of the first and/or the second memory transistor 11, 17, the word line signal WL1 has the value 0 V, the further well voltage WE2 has the value of the second supply voltage VPP, and the third and the fourth bit line signal BL3, BL4 have the value of the bias voltage VBIAS.

In an erasure process for erasing the first and/or the second memory transistor 11, 17, the word line signal WL1 has the value 0 V, the further and the additional word line signals WL2, WL3 have the value of the second supply voltage VPP, the third, fourth, fifth and sixth bit line signals BL3, BL4, BL5, BL6 have the value of the bias voltage VBIAS, and the well voltage WE1 as well as the further and the additional well voltages WE2, WE3 have the value of the second supply voltage VPP. The selection signal SL has the value of the second supply voltage VPP. The terminal voltages SL1, SL2, SL3 are cut off. To erase the first memory transistor 11, the first bit line signal BL1 is provided with a value of the second supply voltage VPP. Thus electrons are drawn away from the floating gate of the first memory transistor 11 to the well 33. To erase the second memory transistor 17, the second bit line signal BL2 is correspondingly placed at the value of the second supply voltage VPP. If the first bit line signal BL1 takes on the value of the bias voltage VBIAS, then the first memory transistor 11 is not erased. Correspondingly, the second memory transistor 17 is not erased if the value of the second bit line signal BL2 takes on the value of the bias voltage VBIAS. Thus it is possible to determine by selecting the first bit line signal BL1 or the second bit line signal BL2 whether the first and/or the second memory transistors 11, 17 are erased.

In a reading process for reading the first bit stored by the first and the second memory transistor 11, 17, the word line signal WL1 has the value 0 V, the further and the additional word line signals WL2, WL3 have the value of the first supply voltage VDD, the third, fourth, fifth and sixth bit line signals BL3, BL4, BL5, BL6 have a floating value, and the well voltages WE1, WE2, WE3 have the value of the first supply voltage VDD. The selection signal SL has the value 0 V. The first bit line 27 and the second bit line 28 are connected via the first and the second changeover switch 64, 65 of the Y-decoder 63 to the first and the second input 24, 25 of the read amplifier 23 in such a manner that the first bit line signal BL1 is routed to the first input 24 and the second bit line signal BL2 is routed to the second input 25 of the read amplifier 23. The first bit line signal BL1 is thus set to correspond to the state of the first memory transistor 11. Correspondingly, the second bit line signal BL2 is generated to correspond to the state of the second memory transistor 17.

Thus, both the first and the second memory transistor 11, 17 are programmed in order to store a bit by means of the first and the second memory transistor 11, 17. After programming, electrons are present on the floating gates of the first and the second memory transistor 11, 17. Then precisely one of the two memory transistors 11, 17 is erased. To store a logic value 1, the first memory transistor 11 is thus not erased after programming, and the second memory transistor 17 is erased. To store a logic value 0, the first memory transistor 11 is thus erased after programming, and the second memory transistor 17 is not erased.

In the programming and erasing of the first and the second memory transistors 11, 17, the memory transistors 35-38, 42-47 and 53-58 are not programmed and are not erased either This is advantageously achieved based on the signals and voltages listed in Table 1B.

By means of the memory arrangement in accordance with FIGS. 1A-1C, a high number of write processes is advantageously achieved. A memory arrangement in accordance with FIGS. 1A-1C advantageously has a low space requirement on the semiconductor body 32, since a number of required wells is kept low.

Figure 2A:
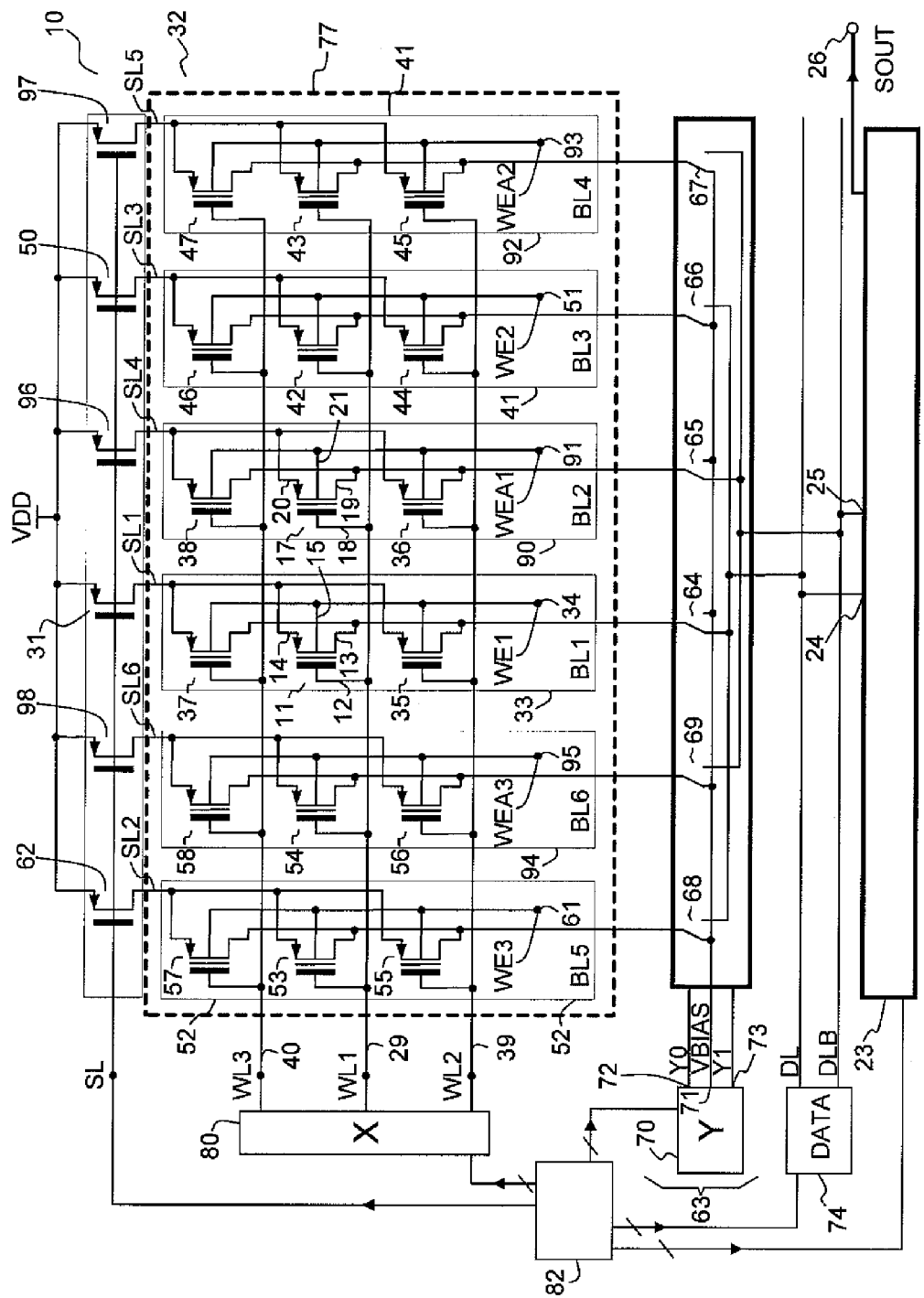

FIG. 2A shows an additional exemplary embodiment of a memory arrangement according to the invention. The memory arrangement 10 in accordance with FIG. 2A is a refinement of the embodiment shown in Figure 1A. Differently from the embodiment in accordance with FIG. 1A, the semiconductor body 32 according to FIG. 2A has a second well 90. The first well 33 thus comprises the first, the third and the fifth memory transistor 11, 35, 37. The second, the fourth and the sixth memory transistor 17, 36, 38 are arranged in the second well 90. The first well 33 is connected by means of the first well terminal 34. Correspondingly, the second well 90 is connected by means of a second well terminal 91. The substrate terminals of the second, the fourth and the sixth memory transistors 17, 36, 38 are connected to the second well terminal 91. A second selection transistor 96 couples the second terminals of the second, fourth and sixth memory transistor 17, 36, 38 to the first supply voltage terminal 31. Correspondingly, the semiconductor body 32 comprises the further well 41 with the further well terminal 51 as well as a third well 92 with a third well terminal 93. The seventh, the ninth and the eleventh memory transistor 42, 44, 46 are arranged in the further well 41. On the other hand, the eighth, the tenth, and the twelfth memory transistors 43, 45, 47, which are connected via a third selection transistor 97 to the first supply voltage terminal 31, are arranged in the third well 92. Analogously, the semiconductor body 32 comprises the additional well 52 with the additional well terminal 61 and a fourth well 94 with a fourth well terminal 95. The additional well 52 thus comprises the thirteenth, the fifteenth and the seventeenth memory transistor 53, 55, 57, and the fourth well 94 comprises the fourteenth, the sixteenth and the eighteenth memory transistor 54, 56, 58, which are connected via a fourth selection transistor 98 to the first supply voltage terminal 31.

The well voltage WE1 is applied to the well terminal 34 of first well 33, and a second well voltage WEA1 is applied to the second well terminal 91 of the second well 90. Correspondingly, the further well voltage WE2 is applied to the further well terminal 51 of the further well 41, and a third well voltage WEA2 is applied to the third well terminal 93 of the third well 92. In addition, the additional well voltage WE3 is applied to the additional well terminal 61 of the additional well 52, and a fourth well voltage WE3 is applied to the fourth well terminal 95 of the fourth well 94.

In one embodiment, the semiconductor body 32 can comprise the second, third and/or fourth selection transistor 96, 97, 98.

In accordance with FIGS. 1A-1C, a write process comprises performing a data-independent programming process, followed by a data-dependent erasure process. A write process for the memory arrangement in accordance with FIG. 2A can likewise comprise a data-independent programming process that is followed by a data-dependent erasure process. The programming process for an arrangement in accordance with FIG. 2A can advantageously be data-dependent, as will be described below with reference to FIGS. 2B and 2C.

Figure 2C:
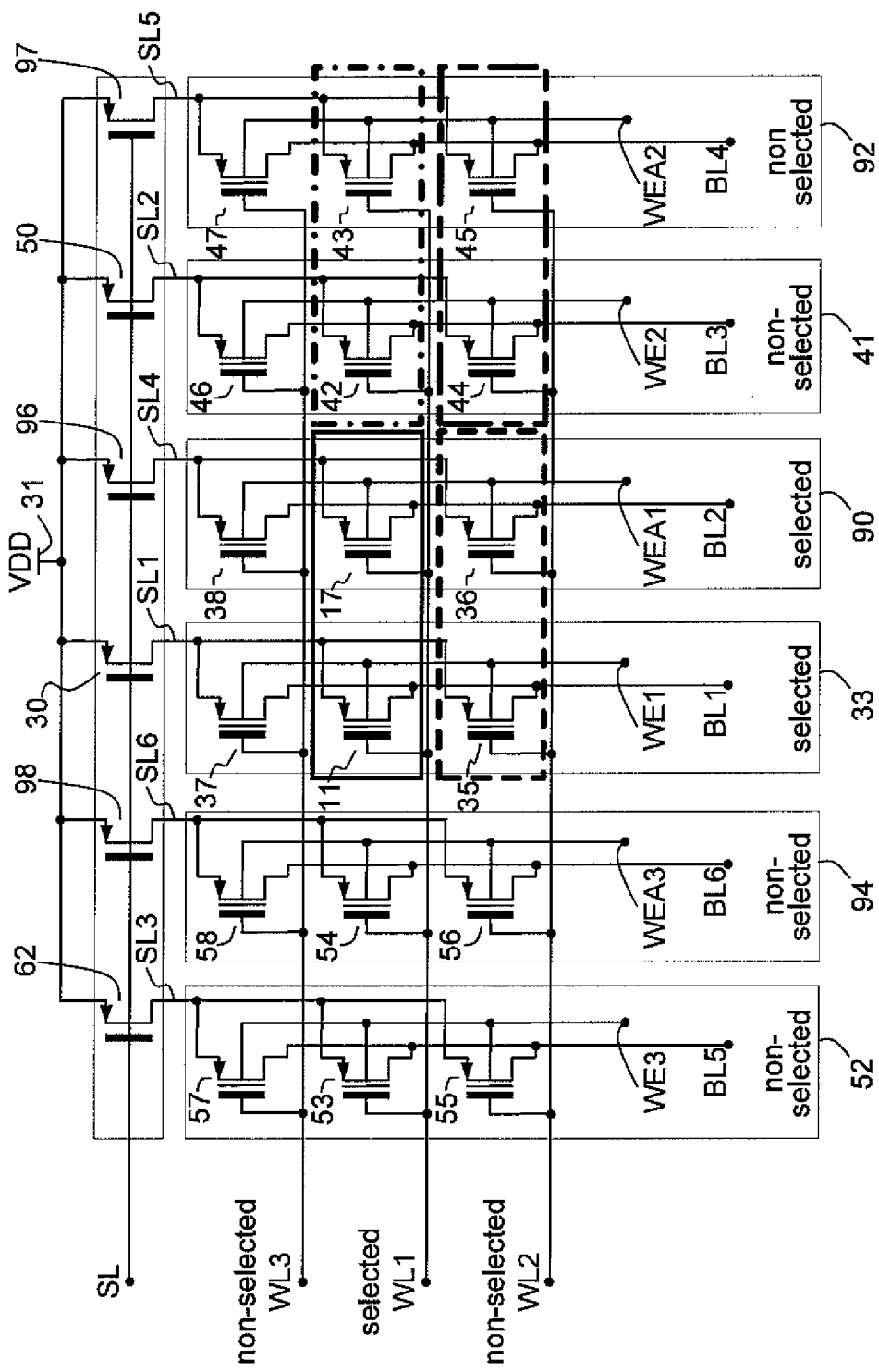

FIG. 2B shows an exemplary embodiment of the signals that are applied to the terminals of the memory arrangement 10 in accordance with FIG. 2A during a programming, an erasing and a reading process. FIG. 2C shows a section of the memory arrangement in accordance with FIG. 2A in which the selected lines and wells are drawn in. For the sake of example, FIGS. 2B and 2C show the programming, erasing and reading of first and second memory transistors 11, 17.

The first and the second memory transistor 11, 17 can be programmed separately. For the programming of the first memory transistor 11, the first bit line signal BL1 takes on the value 0 V, the second bit line BL2 the value VBIAS of the bias voltage, the well voltage WE1 the value 0 V, and the second well voltage WEA1 the value of second supply voltage VPP. The further signals and voltages correspond to the signals and voltages indicated in FIG. 1B. Thus the value of the second supply voltage VPP is present solely between the first well 33 and the control terminal 12 of the first memory transistor 11, so that only the latter is programmed. If the second memory transistor 17 is to be programmed, then the first bit line signal BL1 takes on the value VBIAS of the bias voltage, the second bit line BL2 the value 0 V, the well voltage WE1 the value of the second supply voltage VPP, and the second well voltage WEA1 the value 0 V. Erasing and reading is done with the signals listed in FIG. 2B.

To achieve data-independence in the programming, each memory transistor that is driven by one and the same word line is arranged in a well of its own, for example, the six memory transistors 11, 17, 42, 43, 53, 54 connected to the word line 29 are arranged in the six wells 33, 41, 53, 90, 92, 94. If, for example, the first memory transistor 11 is being programmed and sufficiently many electrons are already present at the floating gate of the first memory transistor 11 from the last programming process, then there is no electron flow via the tunnel oxide between the well and the floating gate, so that the tunnel oxide of first memory transistor 11 does not experience any stress load. Correspondingly, a memory transistor that is already erased and is also to be erased in another writing process does not experience a stress load on the tunnel oxide, since no electrons flow via the tunnel oxide in the erasing process. Only in the case where the value of the bit to be stored is changed, the first and the second memory transistor 11, 17 change their state and the tunnel oxides of the two memory transistors 11, 17 experience a stress load. Thereby, the stress on the tunnel oxide in the memory arrangement in accordance with FIGS. 2A-2C is advantageously lowered in comparison to the stress on the tunnel oxides in a memory arrangement in accordance with FIGS. 1A-1C.

In the programming and the erasing of the first and the second memory transistors 11, 17, the memory transistors 35-38, 42-47 and 53-58 are not programmed or erased. This is advantageously achieved by means of the signals and voltages listed in Table 2B.

By means of the decoupling of the first and the second memory transistors 11, 17 from one another, the programming of the first memory transistor 11 can advantageously be performed independently of the programming of the second memory transistor 17. Thus, the first memory transistor 11 is advantageously programmed only if logic value 1 is to be stored as the first bit. If logic value 0 is to be stored as the first bit, then the first memory transistor 11 is not subjected to a programming process, but only to an erasing process. Thus the number of programming processes and erasing processes of the first memory cell 11 is cut in half. The number of programming and erasing processes for the second memory cell 17 and the additional memory cells is correspondingly reduced. The memory arrangement in accordance with FIGS. 2A-2C advantageously has an even higher maximum number of writing processes in comparison to the memory arrangement in accordance with FIGS. 1A-1C.

Figure 3:
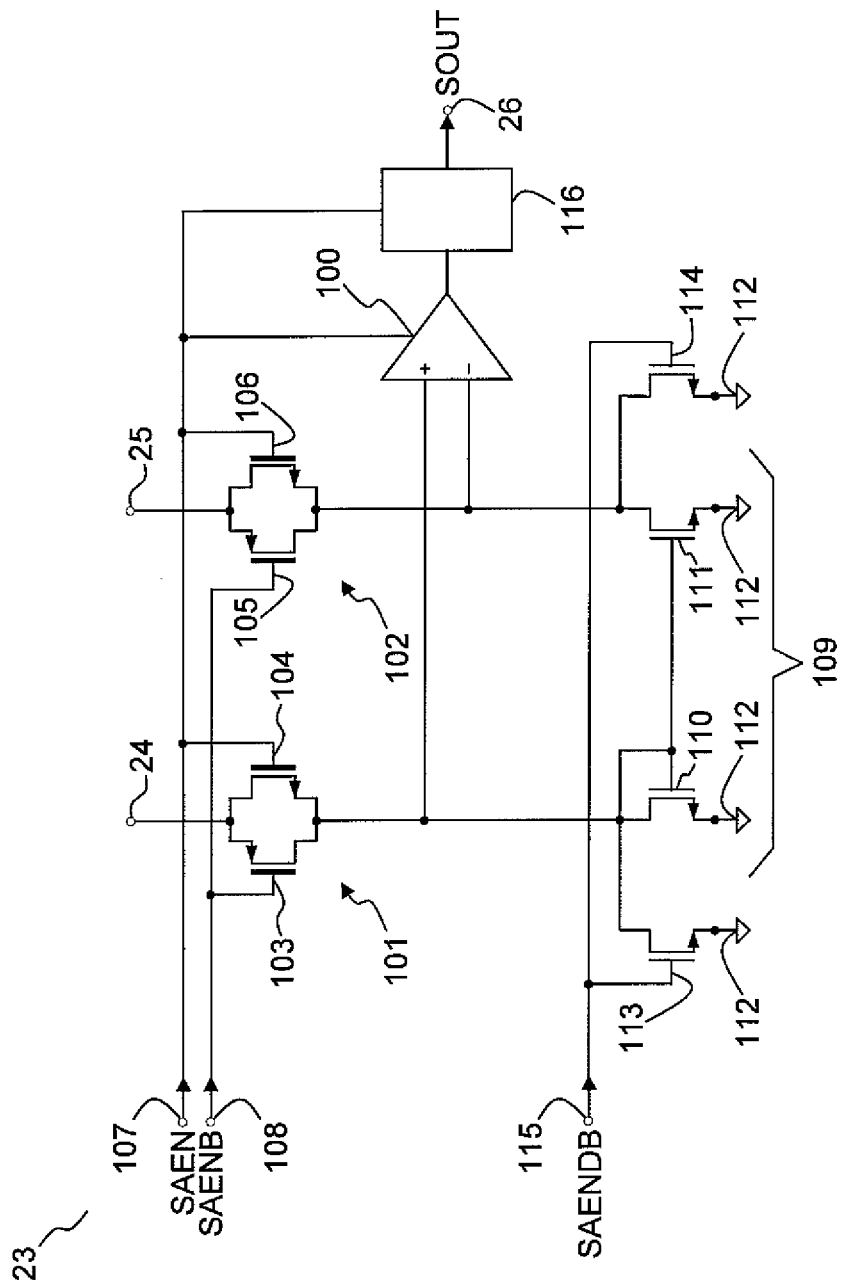

FIG. 3 shows an exemplary embodiment of a read amplifier 23 as used in the memory arrangement 10 in accordance with FIGS. 1A and 2A. The read amplifier 23 comprises the first and the second inputs 24, 25 and the output 26. The read amplifier 23 further comprises a comparator 100 that is coupled at a non-inverting input to the first input 24, and at an inverting input to the second input 25. Read amplifier 23 further comprises a first switch 101 that couples the first input 24 to the non-inverting input of comparator 100. Correspondingly, the read amplifier 23 comprises a second switch 102 that couples the second input 25 to the inverting input of the comparator 100.

The first and the second switch 101, 102 are constructed as transmission gates. The first switch 101 comprises a p-channel transistor 103 and an n-channel transistor 104, each connected at a first terminal to one another and to the first input 24, and at a second terminal, to one another and to the non-inverting input of the comparator 100. Correspondingly, the second switch 102 comprises a further p-channel transistor 105 and a further n-channel transistor 106, each connected at a first terminal to the second input 25, and at a second terminal, to the inverting input of the comparator 100. A control terminal of the n-channel transistor 104 and a control terminal of the further n-channel transistor 106 are connected to a first control input 107. Analogously, a control terminal of the p-channel transistor 103 and a control terminal of the further p-channel transistor 105 are connected to a second control input 108.

The read amplifier 23 comprises a current mirror 109 with a first and a second current mirror transistor 110, 111. A first terminal of the first current mirror transistor 110 is connected to the non-inverting input of the comparator 100, and a first terminal of the second current mirror transistor 111 is connected to the inverting input of the comparator 100. The control terminals of the first and the second current mirror transistor 110, 111 are connected to one another and to the first terminal of the first current mirror transistor 110. The second terminals of the first and the second current mirror transistor 110, 111 are connected to a reference potential terminal 112. The read amplifier 23 additionally comprises a first and a second discharge transistor 113, 114. A first terminal of the first discharge transistor 113 is connected to the first terminal of the first current mirror transistor 110, and thus to the non-inverting input of the comparator 100. A first terminal of the second discharge transistor 114 is connected to the first terminal of the second current mirror transistor 111, and thus to the inverting input of the comparator 100. The second terminals of the first and the second discharge transistor 113, 114 are connected to the reference potential terminal 112. The control terminals of the first and the second discharge transistors 113, 114 are connected to a third control input 115 of the read amplifier 23.

One output of the comparator 100 is connected to the output 26 of the read amplifier 23. A memory 116 is inserted between the output of the comparator 100 and output 26 of the read amplifier 23. The memory 116 is constructed as a volatile memory, known in English as a latch. The memory 116 has a flip-flop, not shown. A control input of the comparator 100 and a control input of the memory 116 are connected to the first control input 107 of the read amplifier 23. The first and the second switch 101, 102 with the transistors 103-106 are implemented in a high-voltage CMOS technology. The other circuit components of the read amplifier 23 are implemented in a low-voltage CMOS technology. In case the memory arrangement 10 comprises a page register, the first and second switch 101, 102 with the transistors 103-106 can be implemented in a low-voltage CMOS technology.

A first, a second and a third control signal SAEN, SAENB, SAENDB is supplied to the first, the second and the third control input 107, 108, 115 of the read amplifier 23. At the beginning of the read process, the third control signal SAENDB is supplied with a value to the first and the second discharge transistor 113, 114 such that the first and the second discharge transistor 113, 114 are switched to a conductive operating state and thus the first and the second current mirror transistor 110, 111 are short-circuited. The first and the second switch 101, 102 are switched on by means of the first and the second control signals SAEN, SAENB. The inverting and the non-inverting input of the comparator 100, as well as the first and the second bit line 27, 28 are thus approximately at the potential of the reference potential terminal 112. Subsequently, the first and the second discharge transistor 113, 114 are switched to a nonconductive operating state.

If the first memory transistor 11 is programmed, so that electrons are present on the floating gate of the first memory transistor 11, then the first bit line signal BL1 assumes approximately the value of the first supply voltage VDD. In this case, there are no electrons on the floating gate of the second memory transistor 17, so that the second memory transistor 17 is in a nonconductive operating state and the second bit line signal BL2 assumes approximately the value of the reference potential. Consequently, the comparator 100 emits a signal with a high voltage value, which corresponds to the logic value 1, at the output of the comparator 100. This signal is stored by means of the memory 116 and provided as an output signal SOUT at the output 26 of the read amplifier 23. If, on the other hand, there are no electrons on the floating gate of the first memory transistor 11 and instead electrons are present on the floating gate of the second memory transistor 17, then the first bit line signal BL1 assumes approximately the value of the reference potential and the second bit line signal BL2 assumes the value of the first supply voltage VDD, so that a signal with a low voltage value, which corresponds to the logic value 0, is present at the output of the comparator 100. This signal is likewise stored by means of memory 116 and emitted as an output signal SOUT at the output 26 of the read amplifier 23.

The memory arrangement 10 advantageously compensates for process fluctuations, fluctuations of the supply voltages and temperature fluctuations. In addition, the memory arrangement 10 compensates for variations in the behavior of the first and the second memory transistor 11, 17 that are produced by differing charge trap characteristics. By virtue of the fully differential memory arrangement, a very high number of maximum write processes can be achieved.

Figure 4A:
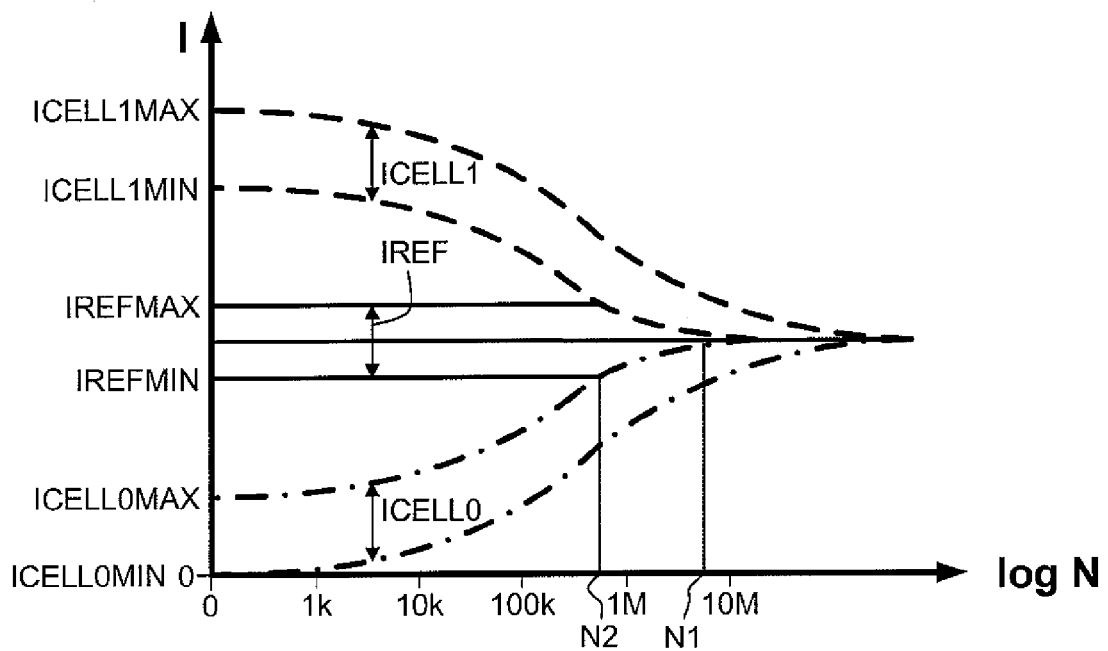

FIG. 4A shows a representation of a current I through the first memory transistor 11 or one of the other memory transistors as a function of a number N of write processes, also referred to as write cycles. The current I is defined as the maximum current between the first and the second terminal 13, 14 of the first memory transistor 11. If there are no electrons on the floating gate of the first memory transistor 11, then the first memory transistor 11 is blocking to a first approximation, and the current I has a value in an interval ICELL0 between a value ICELL0MAX and a value ICELL0MIN. If there are electrons on the floating gate, however, then the first memory transistor 11 becomes conductive, and the current I settles at a value in an interval ICELL1 between a value ICELL1MAX and a value ICELL1MIN. The interval ICELL1 thus represents the programmed state of the first memory transistor 11 and the interval ICELL0 represents the erased state of the first memory transistor 11. The two intervals are caused by variations in the process, the supply voltage and the temperature. With an increasing number N of write processes, more and more electrons are inserted into the tunnel oxide of the first memory transistor 11, and more and more electrons reach the floating gate. Thus the values ICELL0MAX and ICELL1MIN decrease. In return, the values ICELL0MAX and ICELL0MIN increase due to the charges on the charge traps in the tunnel oxide. After a value N1 of the number N of write processes, the values ICELL1MIN and ICELL0MAX are equal, and it is no longer distinguishable whether the first memory transistor 11 is erased or programmed.

A reference current IREF is drawn between the first current ICELL1 and the second current ICELL0. The reference current IREF lies in an interval between a value IREFMAX and a value IREFMIN. The interval is caused by variations in the process, the supply voltage and the temperature. In case whether a memory transistor is erased or programmed is evaluated by means of the reference current IREF, then a value N2 of the number N signifies the maximum number of write processes of the memory arrangement. The value N2 is less than the value N1. Advantageously, no evaluation based on a reference current is performed in the memory arrangements in accordance with FIGS. 1A-2C, since the current I through the first memory transistor 11 is compared to a current through the second memory transistor 17, the second memory transistor 17 having an operating state that is reversed relative to the first memory transistor 11.

Figure 4B:
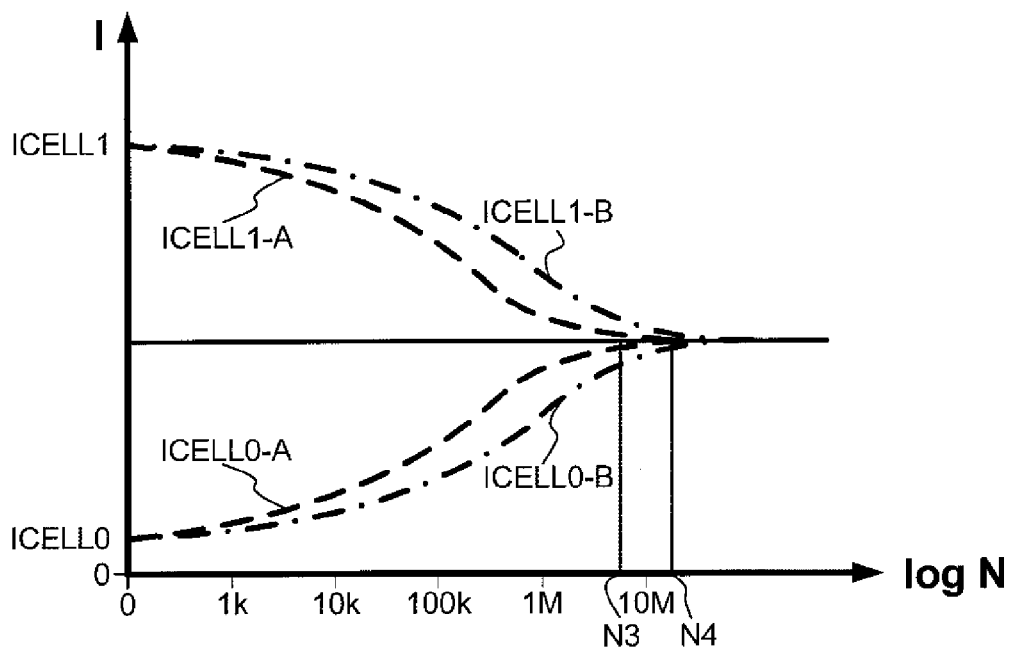

FIG. 4B shows a representation of an example curve of the current I through the first memory transistor 11 as a function of the number N of write processes. The ICELL1-A and ICELL0-A curves show the current I for a memory arrangement in accordance with FIGS. 1A-1C. By contrast, the ICELL1-B and ICELL0-B curves show the current I for a memory arrangement in accordance with FIGS. 2A-2C. The influence of variations in the supply voltage, the process and the temperature is nearly eliminated by means of the differential construction of the read amplifier 23. Because the average number of programming and erasing processes, in which the tunnel oxide experiences a stress load, is smaller in a memory arrangement in accordance with FIGS. 2A-2C than in the memory arrangement in accordance with FIGS. 1A-1C, the service life of the memory arrangement in accordance with FIGS. 2A-2C is increased. The memory arrangement in accordance with FIGS. 1A-1C can be used up to a value N3 of the number N, and the memory arrangement in accordance with FIGS. 2A-2C can be used up to a value N4 of the number N, where the value N4 is greater than the value N3.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A memory arrangement having a semiconductor body, comprising:
    a first memory transistor for non-volatile storage of a first bit in such a manner that the first memory transistor is arranged in a first well which the semiconductor body comprises, wherein the first well is configured to be supplied with a well voltage by a first well terminal;
    a second memory transistor for non-volatile storage of the first bit in inverted form in such a manner that the second memory transistor is arranged in a second well which the semiconductor body comprises, wherein the second well is configured to be supplied with a second well voltage by a second well terminal, wherein the first well comprises the first memory transistor exclusive of the second memory transistor and the second well comprises the second memory transistor exclusive of the first memory transistor;
    a word line that is connected to a control terminal of the first memory transistor and to a control terminal of the second memory transistor; and
    a read amplifier including
        a first input that is coupled to the first memory transistor for supplying a first bit line signal,
        a second input that is coupled to the second memory transistor for supplying a second bit line signal, and
        an output for providing an output signal as a function of the first bit line signal and the second bit line signal,
    wherein:
        the first well comprises, for storing a second bit, a third memory transistor that is coupled to the first input of the read amplifier, and
        for storage of the second bit in inverted form, the second well comprises a fourth memory transistor that is coupled to the second input of the read amplifier.

2. The memory arrangement according to claim 1, in which the memory arrangement is configured such that, after a write process, the second memory transistor is in a different operating state compared to an operating state of the first memory transistor.

3. The memory arrangement according to claim 1, comprising a further word line for driving the third and the fourth memory transistor.

4. The memory arrangement according to claim 1, wherein the first memory transistor is constructed as a field-effect transistor and comprises:
the control terminal, which is connected to the word line;
a first terminal, which is coupled to the first bit line of the read amplifier via a first bit line on which the first bit line signal can be sensed; and
a second terminal that is connected via a first selection transistor to a first supply voltage terminal.

5. The memory arrangement according to claim 4, wherein the second memory transistor is constructed as a field-effect transistor and comprises:
the control terminal, which is connected to the word line,
a first terminal, which is coupled to the second input of the read amplifier via a second bit line on which the second bit line signal can be sensed, and
a second terminal that is connected via the first selection transistor or a second selection transistor to the first supply voltage terminal.

6. The memory arrangement according to claim 1, wherein the first and the second memory transistor are each implemented as a field-effect transistor with an insulated gate electrode or an insulation layer stack for non-volatile charge storage.

7. The memory arrangement according to claim 1, wherein the read amplifier comprises:
a comparator with an output that is coupled to the output of the read amplifier,
a first switch that couples the first input of the read amplifier to a first input of the comparator, and
a second switch that couples the second input of the read amplifier to a second input of the comparator.

8. The memory arrangement according to claim 7, wherein the first and the second switch are each constructed as a transmission gate.

9. The memory arrangement according to claim 7, the read amplifier comprising a current mirror including
a first current mirror transistor that connects the first input of the comparator to a reference potential terminal, and
a second current mirror transistor that connects the second input of the comparator to a reference potential terminal.

10. A memory arrangement having a semiconductor body, comprising:
a first memory transistor for non-volatile storage of a first bit in such a manner that the first memory transistor is arranged in a first well which the semiconductor body comprises, wherein the first well is configured to be supplied with a well voltage by a first well terminal;
a second memory transistor for non-volatile storage of the first bit in inverted form in such a manner that the second memory transistor is arranged in a second well which the semiconductor body comprises, wherein the second well is configured to be supplied with a second well voltage by a second well terminal;
a word line that is connected to a control terminal of the first memory transistor and to a control terminal of the second memory transistor; and
a read amplifier including
a first input that is coupled to the first memory transistor for supplying a first bit line signal,
a second input that is coupled to the second memory transistor for supplying a second bit line signal, and
an output for providing an output signal as a function of the first bit line signal and the second bit line signal,
wherein:
the first well comprises the first memory transistor,
the second well comprises the second memory transistor,
the first well comprises, for storing a second bit, a third memory transistor that is coupled to the first input of the read amplifier, and
for storage of the second bit in inverted form, the second well comprises a fourth
memory transistor that is coupled to the second input of the read amplifier,
wherein the read amplifier comprises:
a comparator with an output that is coupled to the output of the read amplifier,
a first switch that couples the first input of the read amplifier to a first input of the comparator,
a second switch that couples the second input of the read amplifier to a second input of the comparator,
a current mirror including:
a first current mirror transistor that connects the first input of the comparator to a reference potential terminal, and
a second current mirror transistor that connects the second input of the comparator to a reference potential terminal,
a first discharge transistor that is connected at a control terminal to a third control input of the read amplifier and couples the first input of the comparator to the reference potential terminal, and
a second discharge transistor that is connected at a control terminal to the third control input of the read amplifier and couples the second input of the comparator to the reference potential terminal.

11. A method for storing at least one bit, comprising:
non-volatile storage of a first bit in a first memory transistor of a memory arrangement;
non-volatile storage of the first bit in inverted form in a second memory transistor of the memory arrangement; and
simultaneous driving of a control terminal of the first memory transistor and a control terminal of the second memory transistor with a word line signal (WL 1) and provision of an output signal as a function of a first bit line signal of the first memory transistor and of a second bit line signal of the second memory transistor,
wherein the memory arrangement comprises at least one third and one fourth memory transistor for non-volatile storage of at least one additional bit and a semiconductor body,
wherein the first memory transistor is arranged in a first well that the semiconductor body comprises, wherein a well voltage is supplied to the first well by a first well terminal,
wherein the second memory transistor is arranged in a second well that the semiconductor body comprises, wherein a second well voltage is supplied to the second well by a second well terminal,
wherein the first well comprises the first memory transistor exclusive of the second memory transistor and the second well comprises the second memory transistor exclusive of the first memory transistor, and wherein the first well comprises the first and the at least one third memory transistor, and the second well comprises the second and the at least one fourth memory transistor.

12. The method according to claim 11, wherein, in the storage of the first bit, only one memory transistor of a set comprising the first and the second memory transistor is programmed and only one further memory transistor of the set comprising the first and the second memory transistors is erased.

13. A memory arrangement having a semiconductor body, comprising:
   a first memory transistor for non-volatile storage of a first bit in such a manner that the first memory transistor is arranged in an n-doped first well which the semiconductor body comprises, the first memory transistor including a first p-channel MOSFET, wherein the first well is configured to be supplied with a well voltage by a first well terminal;
   a second memory transistor for non-volatile storage of the first bit in inverted form in such a manner that the second memory transistor is arranged in an n-doped second well which the semiconductor body comprises, the second memory transistor including a second p-channel MOSFET, wherein the second well is configured to be supplied with a second well voltage by a second well terminal, wherein the first well comprises the first memory transistor exclusive of the second memory transistor and the second well comprises the second memory transistor exclusive of the first memory transistor;
   a word line that is connected to a control terminal of the first memory transistor and to a control terminal of the second memory transistor; and
   a read amplifier including
      a first input that is coupled to the first memory transistor for supplying a first bit line signal,
      a second input that is coupled to the second memory transistor for supplying a second bit line signal, and
      an output for providing an output signal as a function of the first bit line signal and the second bit line signal,
   wherein:
   the first well comprises, for storing a second bit, a third memory transistor that is coupled to the first input of the read amplifier, and
   for storage of the second bit in inverted form, the second well comprises a fourth memory transistor that is coupled to the second input of the read amplifier.

* * * * *